United States Patent
Kaneko et al.

(10) Patent No.: US 11,894,213 B2
(45) Date of Patent: Feb. 6, 2024

(54) ION MILLING DEVICE

(71) Applicant: Hitachi High-Tech Corporation, Tokyo (JP)

(72) Inventors: Asako Kaneko, Tokyo (JP); Hisayuki Takasu, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 600 days.

(21) Appl. No.: 17/252,997

(22) PCT Filed: Jun. 22, 2018

(86) PCT No.: PCT/JP2018/023782
§ 371 (c)(1),
(2) Date: Dec. 16, 2020

(87) PCT Pub. No.: WO2019/244331
PCT Pub. Date: Dec. 26, 2019

(65) Prior Publication Data
US 2021/0265130 A1    Aug. 26, 2021

(51) Int. Cl.
*H01J 37/20*    (2006.01)
*H01J 37/08*    (2006.01)
(Continued)

(52) U.S. Cl.
CPC .............. *H01J 37/20* (2013.01); *H01J 37/08* (2013.01); *H01J 37/09* (2013.01);
(Continued)

(58) Field of Classification Search
CPC .. H01J 37/20; H01J 37/08; H01J 37/09; H01J 37/1478; H01J 37/3053; H01J 37/317;
(Continued)

(56) References Cited

U.S. PATENT DOCUMENTS 5,854,488 A    12/1998    Aita
5,958,799 A    9/1999    Russell et al.
(Continued)

FOREIGN PATENT DOCUMENTS

JP    3-36285 A    2/1991
JP    7-333828 A    12/1995
(Continued)

OTHER PUBLICATIONS

Machine Translation JP 07-333818 (Year: 1995).*
(Continued)

*Primary Examiner* — Rodney G McDonald
(74) *Attorney, Agent, or Firm* — Crowell & Moring LLP (57) ABSTRACT

An ion milling device capable of high-speed milling is realized even for a specimen containing a material having an imide bond. Therefore, the ion milling device includes: a vacuum chamber 6 configured to hold a specimen 3 in a vacuum atmosphere; an ion gun 1 configured to irradiate the specimen with a non-focused ion beam 2; a vaporization container 17 configured to store a mixed solution 13 of a water-soluble ionic liquid and water; and nozzles 11, 12 configured to supply water vapor obtained by vaporizing the mixed solution to a vicinity of a surface of the specimen processed by the ion beam.

14 Claims, 7 Drawing Sheets

(51) Int. Cl.
   *H01J 37/09* (2006.01)
   *H01J 37/147* (2006.01)
   *H01J 37/305* (2006.01)

(52) U.S. Cl.
   CPC ...... *H01J 37/1478* (2013.01); *H01J 37/3053* (2013.01); *H01J 2237/002* (2013.01); *H01J 2237/1502* (2013.01); *H01J 2237/20214* (2013.01)

(58) Field of Classification Search
   CPC ............. H01J 37/3056; H01J 2237/002; H01J 2237/1502; H01J 2237/20214; H01J 2237/006; H01J 2237/3114; H01J 2237/31745; H01J 2237/026; G01N 1/28; G01N 1/32
   USPC .................................................... 204/298.36
   See application file for complete search history.

(56) References Cited

U.S. PATENT DOCUMENTS

| | | | |
|---|---|---|---|
| 8,541,792 B2* | 9/2013 | Thomsen | C03C 17/245 438/30 |
| 2014/0308813 A1* | 10/2014 | Hsu | H01J 37/3053 438/692 |
| 2015/0221470 A1* | 8/2015 | Ominami | H01J 37/16 250/441.11 |
| 2017/0047198 A1 | 2/2017 | Horinouchi et al. | |
| 2017/0200589 A1 | 7/2017 | Chandler | |
| 2017/0221671 A1 | 8/2017 | Asai et al. | |

FOREIGN PATENT DOCUMENTS

| | | |
|---|---|---|
| JP | 10-12177 A | 1/1998 |
| JP | 11-503574 A | 3/1999 |
| JP | 2000-28800 A | 1/2000 |
| JP | 2002-319365 A | 10/2002 |
| JP | 2010-066219 A | 3/2010 |
| JP | 2012-68227 A | 4/2012 |
| JP | 2012-193962 A | 10/2012 |
| JP | 2016-31870 A | 3/2016 |
| JP | 2017-135375 A | 8/2017 |
| KR | 10-2015-0016351 A | 2/2015 |
| WO | WO 2015/170400 A1 | 11/2015 |
| WO | WO 2017/203676 A1 | 11/2017 |

OTHER PUBLICATIONS

Machine Translation JP 03-036285 (Year: 1991).*
International Search Report (PCT/ISA/210) issued in PCT Application No. PCT/JP2018/023782 dated Sep. 18, 2018 with English translation (four (4) pages).
Japanese-language Written Opinion (PCT/ISA/237) issued in PCT Application No. PCT/JP2018/023782 dated Sep. 18, 2018 (four (4) pages).
Stark et al., "$H_2O$ Enhanced Focused Ion Beam Micromachining", J. Vac. Sci. Technol., Nov./Dec. 1995, pp. 2565-2569, vol. B 13, No. 6, (five (5) pages).
Korean-language Office Action issued in Korean Application No. 10-2020-7035697 dated Aug. 10, 2022 with English translation (10 pages).

* cited by examiner

ION MILLING DEVICE

TECHNICAL FIELD

The present invention relates to an ion milling device for producing a plane surface or a cross section of a specimen by using an ion beam.

BACKGROUND ART

An ion milling device is used as a specimen pretreatment device for a scanning electron microscope (SEM) or the like to produce planes or cross sections of a specimen to be observed in a wide range of fields. The ion milling device is a device that irradiates the specimen with an ion beam to process a specimen surface by physical sputtering, performs irradiation with the ion beam without focusing and scanning, and polishes the specimen surface. There are a plane milling method and a cross-section milling method. The plane milling method is a method of directly irradiating a specimen surface with an ion beam to grind a specimen, and it is possible to grind a wide range of specimens at a high speed. In the cross-section milling method, a shielding plate is placed between an ion source and a specimen, the specimen is set so as to protrude from the shielding plate by several μm to 200 μm, and a portion of the specimen protruding from the shielding plate is irradiated with an ion beam, so that a smooth specimen cross section can be formed along an end surface of the shielding plate.

In recent years, there is a need for an ion milling device to process a material having a low sputtering yield, such as ceramics or cemented carbide, in a wide range and in a short time. For example, PTL 1 discloses an ion gun capable of increasing an amount of released ions to increase a milling speed.

On the other hand, there are materials that have resistance to an ion beam and are difficult to process by an ion milling device. An example is a polyimide resin used for a passivation film of a semiconductor device. A material having an imide bond is resistant to an ion beam and takes a long time to process, and when an acceleration voltage of the ion beam is increased to shorten a milling time, the material is sublimated or melted by irradiation heat of the ion beam. Therefore, it is difficult to process a specimen containing the material having the imide bond by the ion milling device.

In order to create a specimen slice for a transmission electron microscope (TEM), a focused ion beam (FIB) device is used as the specimen pretreatment device. The FIB device has the same principle of processing specimens as the ion milling device, and thus the FIB device also has a similar problem when the material having the imide bond is processed. Non-PTL 1 discloses that by adding water molecules (water vapor) as an assist gas to an ion beam, a milling time of a C-containing material such as polyimide by the FIB device can be significantly shortened.

CITATION LIST

Patent Literature

PTL 1: JP-A-2016-31870

Non-Patent Literature

Non-PTL 1: T. J. Stark et al. "H2O enhanced focused ion beam micromachining", J. Vac. Sci. Technol. B 13 (6), November/December 1995, p. 2565 to 2569

SUMMARY OF INVENTION

Technical Problem

A reason why the material having the imide bond can be processed at a high speed by the FIB device by using the water vapor as the assist gas is considered to be that the material having the imide bond is hydrolyzed due to presence of water molecules. The FIB device and the ion milling device are common in processing a specimen by physical sputtering with an ion beam, even in the ion milling device, it is considered that milling time of polyimide can be significantly shortened by adding water molecules (water vapor) as the assist gas to the ion beam.

However, a processing range of the FIB device is extremely narrow, which is about several tens of μm in diameter, while the ion milling device requires a processing range of 1 mm in diameter or more. A specimen to be irradiated with the ion beam is placed in a specimen chamber (vacuum chamber) maintained in a high vacuum. Since the ion milling device has a large processing range as compared with the FIB device having a narrow processing range, it is extremely difficult to stably supply water molecules to a processing region. Even when water vapor (water molecules) is supplied in a vacuum atmosphere, the water molecules are immediately scattered and cannot be kept in a vicinity of a specimen processing surface. For this reason, when water vapor is excessively supplied to the specimen chamber, vacuum degree in the specimen chamber is lowered, which adversely affects the ion beam.

Solution to Problem

An ion milling device according to an embodiment of the invention includes: a vacuum chamber configured to hold a specimen in a vacuum atmosphere; an ion gun configured to irradiate the specimen with a non-focused ion beam; a vaporization container configured to store a mixed solution of a water-soluble ionic liquid and water; and nozzles configured to supply water vapor obtained by vaporizing the mixed solution to a vicinity of a surface of the specimen processed by the ion beam.

Advantageous Effect

An ion milling device capable of high-speed milling is provided even for a specimen containing a material having an imide bond.

Other technical problems and novel characteristics will be apparent from a description of the description and the accompanying drawings.

DESCRIPTION OF EMBODIMENTS

Hereinafter, embodiments of the invention will be described with reference to the drawings.

First Embodiment

Figure 1:
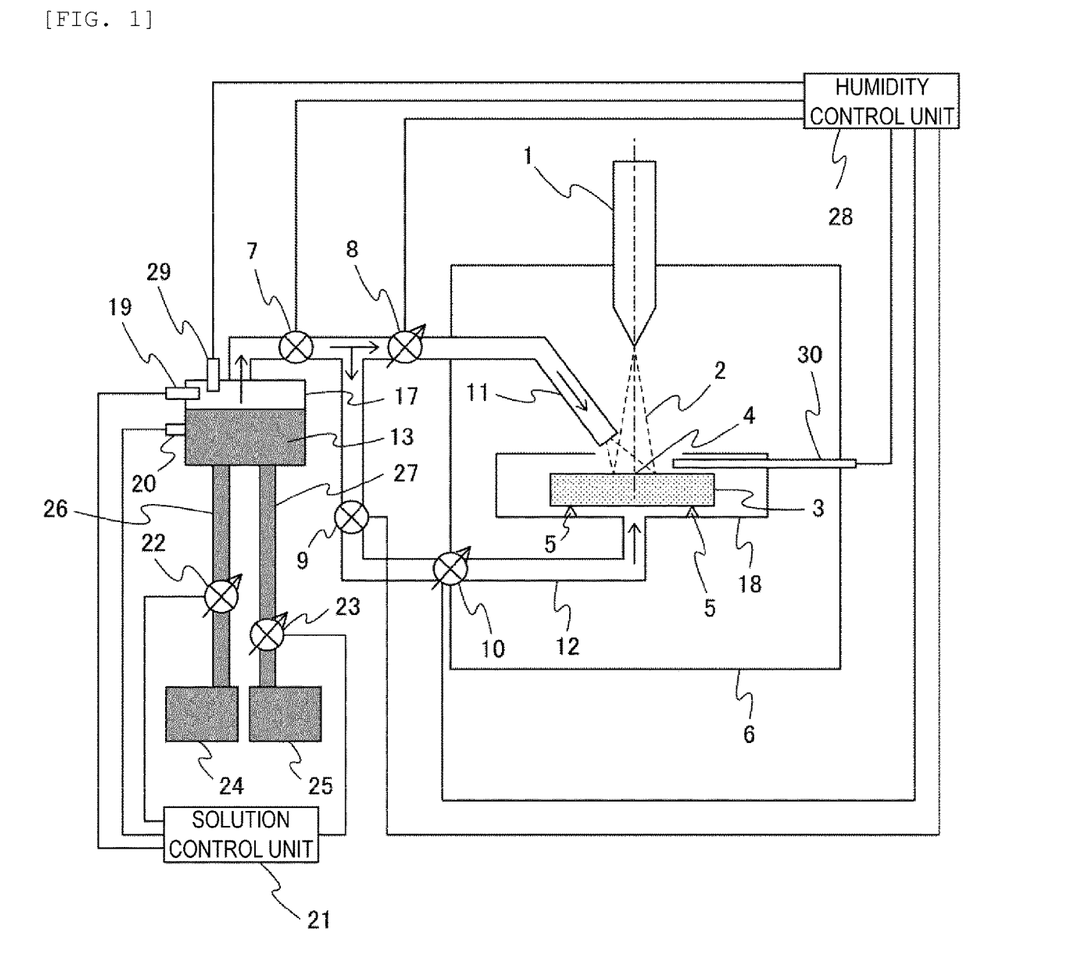
FIG. 1 shows an ion milling device according to a first embodiment.

FIG. 1 shows an ion milling device according to the first embodiment. The first embodiment has a configuration suitable for plane milling. A specimen 3 is a specimen containing a material having an imide bond, is held in a vacuum atmosphere in a vacuum chamber 6, and is irradiated with an unfocused ion beam 2 from the ion gun 1, so that a surface thereof is processed. In order to process the material having the imide bond, this device includes a water vapor supply mechanism that supplies water molecules as an assist gas while irradiation is performed with the ion beam 2. Further, in order to prevent the water molecules from scattering from a vicinity of a specimen processing surface of the specimen 3 as much as possible, a specimen container 18 is provided in the vacuum chamber 6, and the specimen 3 is placed on a specimen holding portion 5 of the specimen container 18. A shape of the specimen container 18 is not particularly limited, but the specimen container 18 is a cylindrical container and includes an opening portion, on an upper surface, through which at least the ion beam 2 passes. Alternatively, the specimen container 18 may have a shape in which the entire upper surface is opened like a petri dish. Alternatively, an upper side of the specimen container 18 may have a squeezed shape instead of the cylindrical shape. In this example, the water vapor supply mechanism includes a first nozzle 11 and a second nozzle 12. During the processing with the ion beam 2, the first nozzle 11 supplies water molecules from the opening portion of the specimen container 18, and the second nozzle 12 supplies water molecules from a bottom surface of the specimen container 18. The first nozzle 11 can increase a proportion of water molecules that reach the vicinity of a specimen processing surface 4 by directly injecting water vapor (water molecules) to the specimen 3 from the opening portion of the specimen container 18. The second nozzle 12 can increase an amount of water molecules that reach the vicinity of the specimen processing surface of the specimen 3 by injecting water vapor (water molecules) from the bottom surface of the specimen container 18 to scatter the water vapor over a wall surface of the specimen container 18. Therefore, it is desirable to make the opening portion on the upper surface of the specimen container 18 as small as possible, but as will be described later, there may be a case where the ion beam 2 is tilted with respect to the specimen surface so as to perform radiation, and thus, a margin for that case is necessary. In this way, the specimen container 18 and the nozzles 11, 12 are disposed, so that the water molecules remain as close as possible in the vicinity of the specimen processing surface of the specimen 3.

Further, the water vapor supply mechanism of the first embodiment controls a pressure of water vapor supplied as the assist gas, and reduces the amount of water molecules supplied from the nozzles 11, 12, so that a decrease in vacuum degree due to excessive supply of the water vapor to the vacuum chamber 6 is prevented. The water vapor supply mechanism will be described below.

A vaporization container 17 stores a mixed solution 13 of an ionic liquid stored in an ionic liquid storage unit 24 and water stored in a water storage unit 25, and vaporizes the mixed solution 13, so that the pressure of the water vapor is reduced (Raoult's law), and water vapor having a low vapor pressure is introduced into the vacuum chamber 6. By reducing the pressure of the introduced vapor water, the amount of water molecules supplied to the vacuum chamber 6 can be reduced. Here, as the ionic liquid, a water-soluble ionic liquid which has a melting point of 100° C. or lower and is dilutable with water is used.

The water vapor supply mechanism is disposed in an atmospheric-pressure atmosphere outside the vacuum chamber 6 except for the nozzles 11, 12 and pipe portions connected to the nozzles. The ionic liquid storage unit 24 for storing the ionic liquid is connected to the vaporization container 17 via a pipe 26, and the water storage unit 25 for storing water is connected to the vaporization container 17 via a pipe 27. In the vaporization container 17, a liquid level sensor 19 monitors an amount of the mixed solution 13, and a densitometer 20 measures a concentration of the mixed solution 13. In order to keep a liquid level and the concentration of the mixed solution 13 measured by the densitometer 20 at optimum values, a solution control unit 21 sends control signals respectively to a flow rate adjusting valve 22 provided in the pipe 26 and a flow rate adjusting valve 23 provided in the pipe 27, so that the ionic liquid and water are supplied from the ionic liquid storage unit 24 and the water storage unit 25 to the vaporization container 17 through the pipes 26, 27, respectively.

A dew point meter 29 is further provided in the vaporization container 17 to measure a concentration (humidity) of water vapor retained in the vaporization container 17. On the other hand, a dew point meter 30 is also provided in the vicinity of the specimen processing surface 4 of the specimen container 18 to measure a concentration (humidity) of water vapor in the vicinity of the specimen processing surface 4, and a humidity control unit 28 monitors each measured value. The humidity control unit 28 controls the amount of water vapor supplied from the nozzles 11, 12 based on the measured values of the dew point meter 29 and the dew point meter 30. When the measured value of the dew point meter 29 is larger than the measured value of the dew point meter 30, the humidity control unit 28 sends control signals to an open/close valve 7 and a flow rate adjusting valve 8 to inject water vapor from the nozzle 11, and sends control signals to an open/close valve 9 and a flow rate adjusting valve 10 to inject water vapor from the nozzle 12, so that the concentration of the water vapor in the vicinity of the specimen processing surface 4 is increased. In order to set the concentration of the water vapor in the vicinity of the specimen processing surface 4 measured by the dew point meter 30 at a desired value, for example, equal to the measured value of the dew point meter 29, the humidity control unit 28 controls the open/close valve 7, the flow rate adjusting valve 8, the open/close valve 9, and the flow rate adjusting valve 10 to adjust the amount of water vapor supplied from the nozzles or stop the supply. Both of the two nozzles may be used, or only one nozzle may be used. Further, water vapor may be continuously supplied, or may be intermittently supplied by periodically opening/closing the open/close valves 7, 9 controlled according to a pulse signal. By intermittently supplying water vapor, the amount of water vapor supplied from the nozzle into the vacuum chamber 6 can be further reduced.

The water vapor (water molecules) retained in the vicinity of the specimen processing surface 4 becomes the assist gas of the ion beam 2 emitted from the ion gun 1, and accelerates a processing speed of the specimen 3 containing the material having the imide bond. Further, the water vapor supplied into the vacuum chamber 6 is introduced into the vacuum atmosphere from the atmospheric-pressure atmosphere and expands at once, so that there is also a cooling effect of lowering a temperature of the specimen 3 in the vacuum chamber 6. As a result, there is an effect of preventing the specimen 3 from sublimating or melting due to irradiation heat of the ion beam 2.

Figure 2:
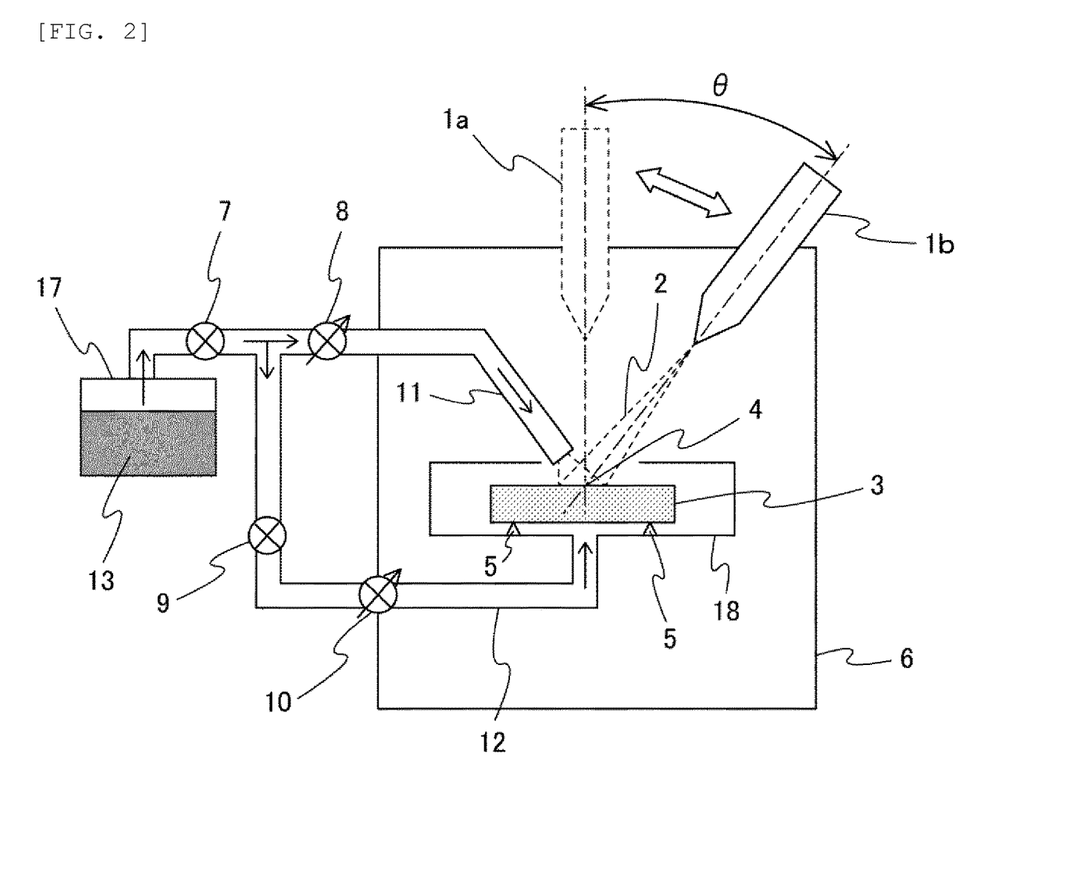
FIG. 2 shows an ion milling device in which an ion gun is provided with a tilt mechanism.

FIG. 2 shows the ion milling device shown in FIG. 1 provided with a tilt mechanism for the ion gun 1. By tilting the ion gun 1 at a tilt angle θ, the surface of the specimen 3 can be evenly processed in a wider range. The tilt mechanism allows the tilt angle θ of the ion gun 1 to be freely adjusted from 0 to 90°, and the tilt angle θ of the ion gun 1 can control unevenness formation on the specimen surface.

Figure 3:
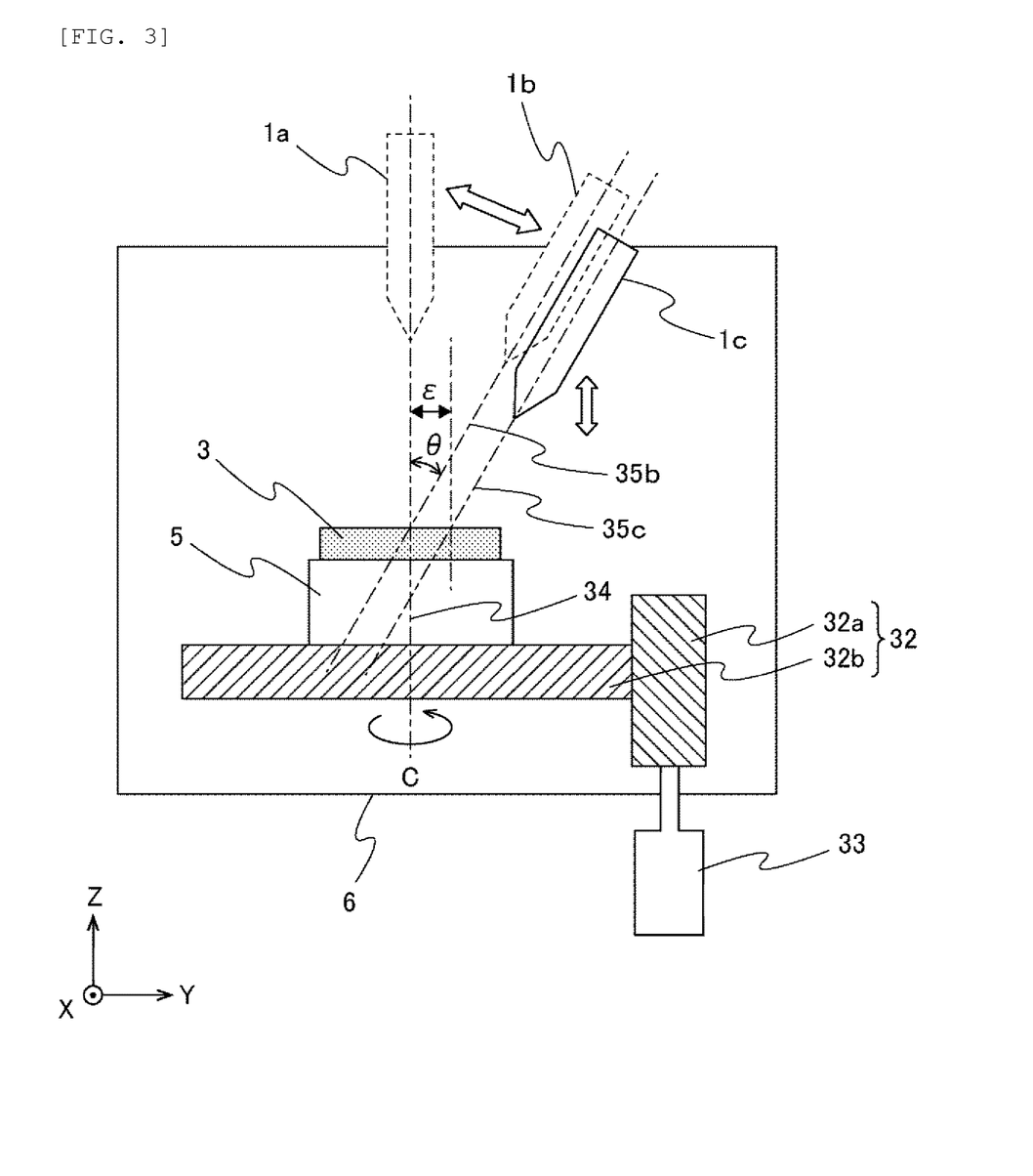
FIG. 3 shows an ion milling device provided with a specimen rotating mechanism.

FIG. 3 shows an ion milling device provided with a specimen rotating mechanism for rotating the specimen 3. The specimen 3 is placed on the specimen holding portion 5 on a worm gear 32, and a motor 33 driving a cylindrical worm 32a rotates, such that a worm wheel (turntable) 32b rotates around a center axis c in a vertical direction. A center 34 of the specimen holding portion 5 is provided in alignment with the center axis c, and the specimen holding portion 5 and the specimen 3 rotate as the worm wheel 32b rotates. When the tilt angle θ of the ion gun 1 is 0°, a center of the ion gun coincides with the center 34 of the specimen holding portion 5 and the center axis c.

In addition to the tilt mechanism, the ion gun 1 is provided with a moving mechanism that moves the ion gun 1 in a Z direction (vertical direction) or a Y direction (horizontal direction). By the moving mechanism moving the ion gun 1, the center 34 of a specimen stub and a center 35 of the ion gun are eccentric by s, and a wider range of the specimen surface can be evenly processed.

Figure 4:
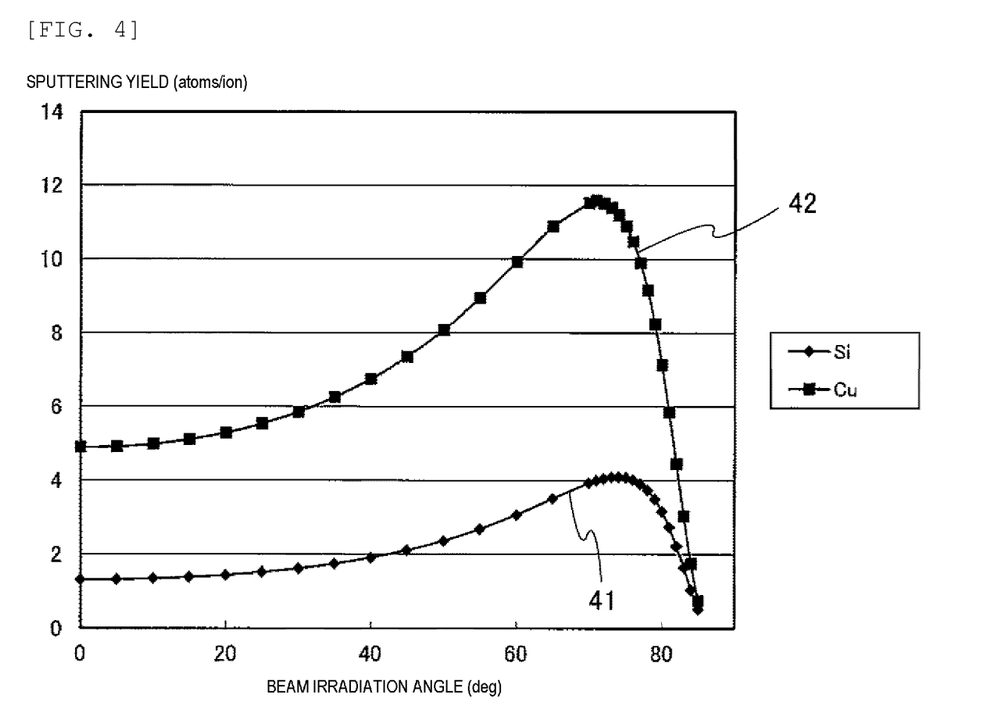
FIG. 4 is a diagram showing a beam irradiation angle dependency of a milling rate.

An ion beam milling processing speed (sputtering yield) depends on an irradiation angle of the ion beam 2, and also depends on a material to be processed. FIG. 4 shows beam irradiation angle dependency 41 of Si and beam irradiation angle dependency 42 of Cu. By utilizing this property and controlling the beam irradiation angle, a desired processing surface can be obtained.

For example, the center 34 of the specimen holding portion 5 and the center of the ion gun are eccentric by s by the moving mechanism of the ion gun 1, and meanwhile an ion gun center 35c is kept at 30° with respect to the specimen surface by the tilt mechanism of the ion gun 1, so that the processing is performed by the irradiation with the ion beam 2. As shown in FIG. 4, when the beam irradiation angle is about 30°, there is a large difference in a milling rate depending on the material. Therefore, an uneven surface that reflects the difference in the milling rate due to a structure and crystal orientation of the specimen material can be formed. Such a processing surface is suitable for a purpose of observing crystal grain boundaries and discriminating layers in a cross section of a multilayer film.

On the other hand, while an axis of the ion gun center 35c is kept at 80° with respect to the specimen surface by the tilt mechanism of the ion gun 1, the processing is performed by the irradiation with the ion beam 2. As shown in FIG. 4, when the beam irradiation angle is about 80°, there is a small difference in the milling rate depending on the material. Therefore, a relatively flat processing surface in which the unevenness formation due to the difference in the milling rate of a specimen material composition is prevented can be formed, and is suitable for a purpose of final finishing which is for removing polishing marks that cannot be avoided by mechanical polishing.

Figure 5A:
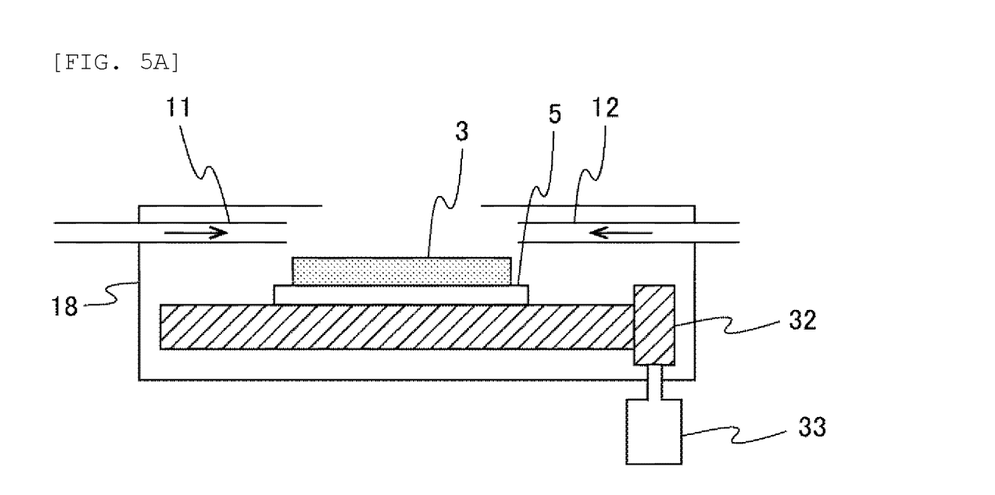
FIG. 5A shows an arrangement example of the specimen rotating mechanism.

FIG. 5A shows an example in which a worm gear that constitutes the specimen rotating mechanism is built in the specimen container 18. In this case, when the second nozzle 12 is disposed at a bottom of the specimen container 18 as shown in FIG. 1, there is a possibility that water molecules may be difficult to reach the vicinity of the specimen processing surface 4 due to blocked by the worm wheel (turntable). Therefore, in this example, the specimen 3 is placed on the specimen holding portion 5 disposed on the worm wheel (turntable), and the nozzle is disposed such that water vapor is supplied to the specimen 3 from a side surface of the specimen container 18. The nozzle 11 and the nozzle 12 are disposed at positions higher than the specimen processing surface 4 of the specimen 3. The example in which water vapor is supplied from two nozzles is shown here, but the number of the nozzles is not particularly limited.

Figure 5B:
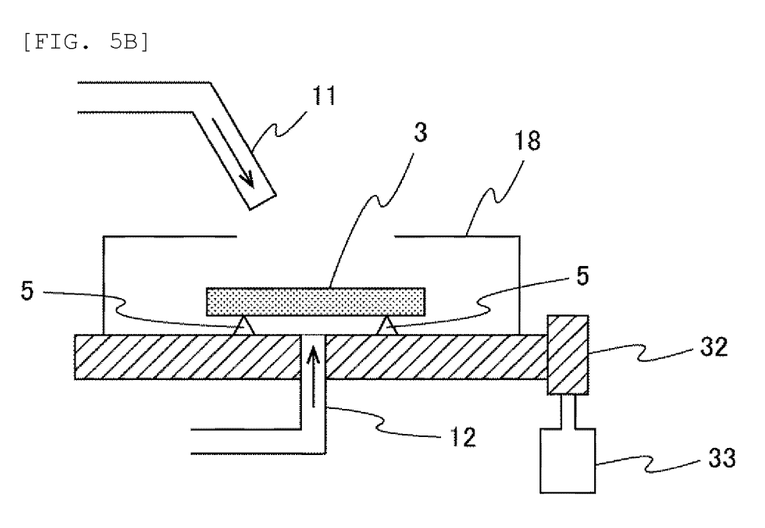
FIG. 5B shows an arrangement example of the specimen rotating mechanism.

Further, FIG. 5B shows an example in which the specimen container 18 is disposed on the worm wheel (turntable). In this example, the second nozzle 12 is disposed so as to penetrate a center of the worm wheel.

Second Embodiment

Figure 6:
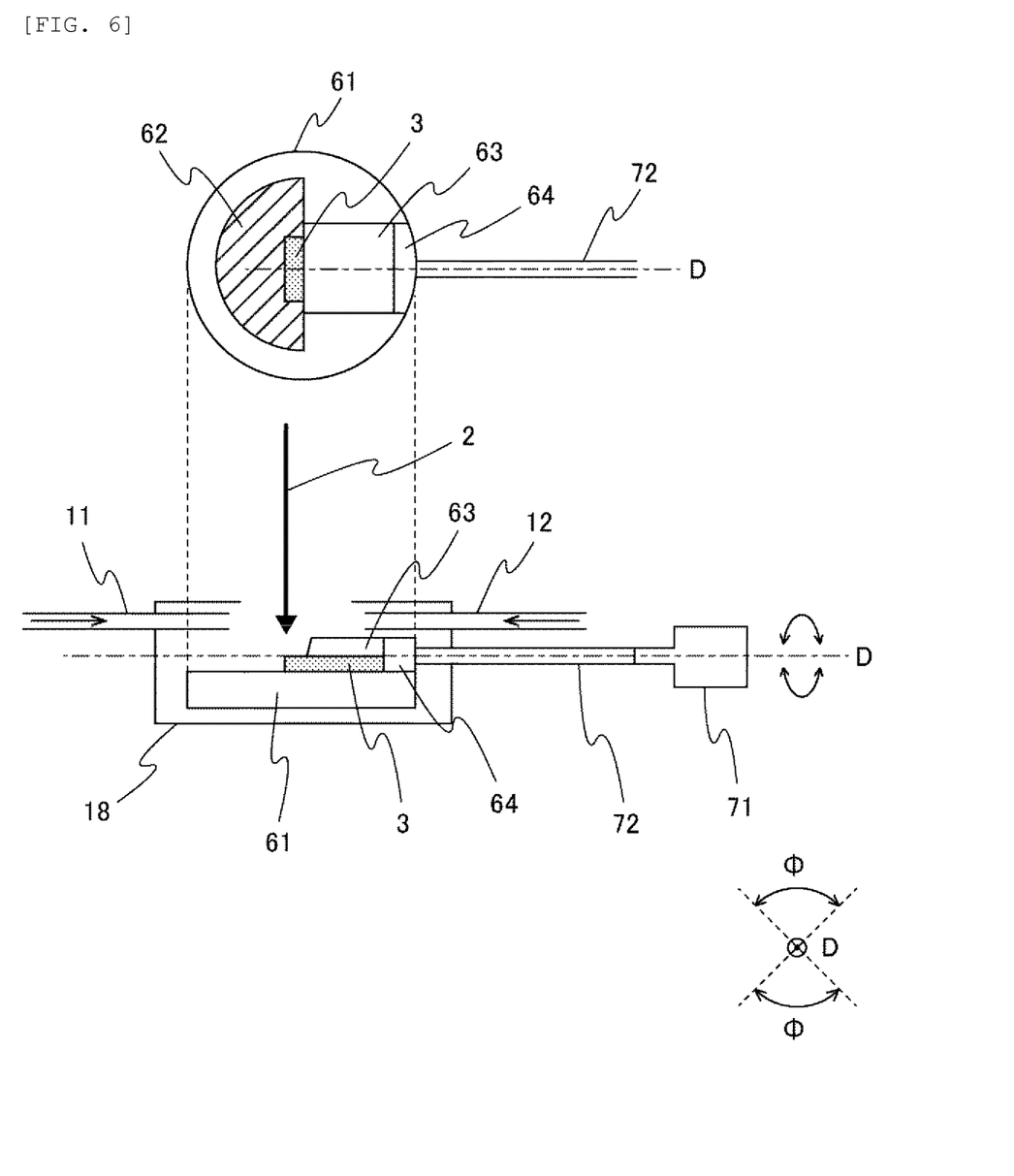
FIG. 6 is a diagram showing a vicinity of a specimen container of an ion milling device according to a second embodiment.

FIG. 6 shows an ion milling device suitable for cross-section milling and shows the vicinity of the specimen container 18. Parts not shown in FIG. 6 are common to those in FIG. 1. A cross section of the specimen 3 is produced by using a shielding plate 63. A specimen holding portion 61 is coupled to a swing shaft 72 by a coupling portion 64, and the swing shaft 72 is coupled to the motor 71. The motor 71 swings the swing shaft 72 clockwise and counterclockwise around a center axis D by an angle φ. The center axis D extends in the horizontal direction, passes through a center of the specimen holding portion 61, and is disposed at a position as high as an upper surface of the specimen 3. The specimen holding portion 61 is provided with an opening portion 62. The specimen 3 is placed on the specimen holding portion 61 so as to protrude a predetermined length from the shielding plate 63, and a protruding portion of the specimen 3 is located in the opening portion 62 of the specimen holding portion 61. While the specimen 3 is swung clockwise and counterclockwise around the center axis D by the motor 71, by irradiating the specimen 3 with the ion beam 2 from immediately above, cross-section milling is performed on the specimen 3. Since the specimen 3 protrudes into the opening portion 62 of the specimen holding portion 61, phenomenon that the ion beam 2 hits the specimen holding portion 61, the specimen holding portion 61 is sputtered, and the cross section of the specimen 3 is contaminated are prevented.

Also in this embodiment, in order to shorten milling time of the material having the imide bond, water vapor is supplied. In the configuration of FIG. 6, since the specimen holding portion 61 performs a swing operation, in order to stably supply water vapor to the vicinity of the specimen processing surface, the nozzles are disposed such that water vapor is injected from the side surface of the specimen container 18 to the specimen 3. Similar to FIG. 5A, the nozzle 11 and the nozzle 12 are disposed at positions higher than the upper surface of the specimen 3. Here, the example in which water vapor is supplied from two nozzles is shown here, but the number of the nozzles is not particularly limited.

Figure 7:
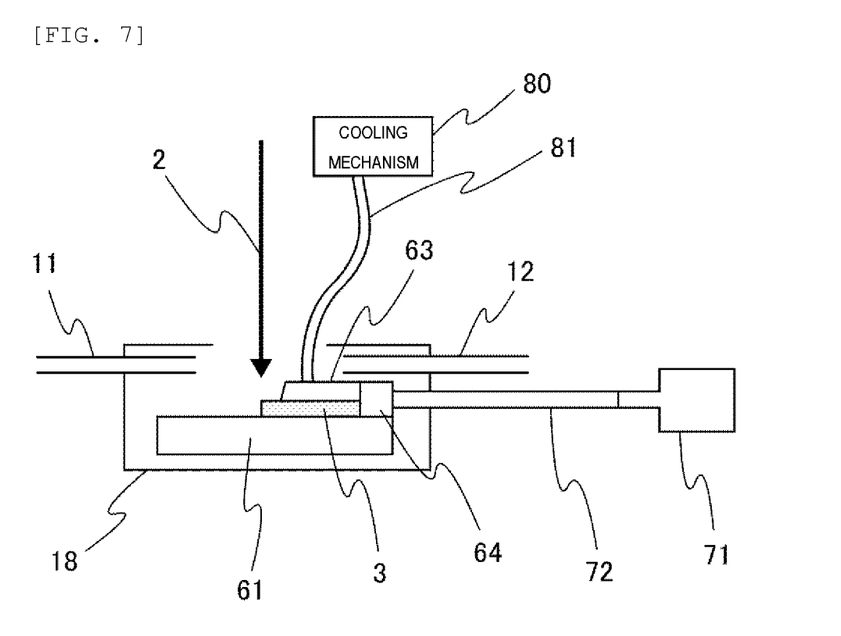
FIG. 7 shows an ion milling device provided with a cooling mechanism.

FIG. 7 shows an ion milling device provided with a cooling mechanism. By connecting an upper surface of the shielding plate 63 and a cooling mechanism 80 with a braided wire 81, the specimen 3 is cooled via the shielding plate 63. In addition to a cooling effect by injecting water vapor from the first nozzle 11 and the second nozzle 12, the cross-section milling can be performed while the specimen 3 is further cooled. In particular, in order to reduce thermal damage to the specimen 3 due to a temperature rise of the specimen 3 by the ion beam 2, when a cross-section of a low melting point specimen is produced, it is common to irradiate the specimen 3 with the ion beam 2 having low energy, but by providing the cooling mechanism 80, an effect of irradiation heat due to the ion beam 2 can be further reduced.

REFERENCE SIGNS LIST

1: ion gun, 2: ion beam, 3: specimen, 4: specimen processing surface, 5, 61: specimen holding portion, 6: vacuum chamber, 7, 9: open/close valve, 8, 10: flow rate adjusting valve, 11, 12: nozzle, 13: mixed solution, 17: vaporization container, 18: specimen container, 19: liquid level sensor, 20: densitometer, 21: solution control unit, 22, 23: flow rate adjusting valve, 24: ionic liquid storage unit, 25: water storage unit, 26, 27: pipe, 28: humidity control unit, 29, 30: dew point meter, 32: worm gear, 33: motor, 62: opening portion, 63: shielding plate, 64: coupling portion, 71: motor, 72: swing shaft, 80: cooling mechanism, 81: braided wire.

The invention claimed is:

1. An ion milling device comprising:
a vacuum chamber configured to hold a specimen in a vacuum atmosphere;
an ion gun configured to irradiate the specimen with a non-focused ion beam;
a vaporization container configured to store a mixed solution of a water-soluble ionic liquid and water;
a nozzle configured to supply water vapor obtained by vaporizing the mixed solution to a vicinity of a surface of the specimen processed by the ion beam; and
a liquid level sensor configured to monitor a liquid level of the mixed solution in the vaporization container;
a densitometer configured to measure a concentration of the mixed solution in the vaporization container; and
a solution control unit configured to control, based on the liquid level and the concentration of the mixed solution, an amount of the ionic liquid and an amount of the water supplied to the vaporization container.

2. The ion milling device according to claim 1, further comprising:
a specimen container provided in the vacuum chamber and having an opening portion on an upper surface, wherein
the specimen is placed in the specimen container, and a processing surface of the specimen is irradiated with the ion beam from the opening portion of the specimen container.

3. The ion milling device according to claim 2, wherein the nozzle includes a first nozzle and a second nozzle, the first nozzle is disposed to inject the water vapor from the opening portion of the specimen container to the processing surface of the specimen, and
the second nozzle is disposed to supply the water vapor from a bottom of the specimen container into the specimen container.

4. The ion milling device according to claim 3, further comprising:
a specimen rotating mechanism having a turntable that rotates around a center axis in a vertical direction, wherein
the specimen container is disposed on the turntable, and
the second nozzle is disposed to supply, through a center of the turntable, the water vapor from the bottom of the specimen container into the specimen container.

5. The ion milling device according to claim 4, further comprising:
a tilt mechanism configured to tilt the ion gun; and a moving mechanism configured to move the ion gun in the vertical direction or a horizontal direction.

6. The ion milling device according to claim 2, further comprising:
a specimen rotating mechanism disposed in the specimen container, and having a turntable that rotates around a center axis in a vertical direction; and
a specimen holding portion disposed on the turntable, wherein
the specimen is placed on the specimen holding portion, and
the nozzle is disposed to supply the water vapor from a side surface of the specimen container into the specimen container.

7. The ion milling device according to claim 6, further comprising:
a tilt mechanism configured to tilt the ion gun; and a moving mechanism configured to move the ion gun in the vertical direction or a horizontal direction.

8. The ion milling device according to claim 1, wherein the vaporization container is disposed in an atmospheric-pressure atmosphere.

9. The ion milling device according to claim 2, further comprising:
a specimen holding portion disposed in the specimen container and configured to hold the specimen; and
a shielding plate that shields the specimen from the ion beam, wherein
the specimen is disposed to protrude a predetermined length from the shielding plate, and is placed such that a portion of the specimen that protrudes from the shielding plate is located at an opening portion of the specimen holding portion.

10. The ion milling device according to claim 9, further comprising:
a swing shaft coupled to the specimen holding portion and having a center axis in a horizontal direction, wherein
the swing shaft swings clockwise and counterclockwise around the center axis by a predetermined angle.

11. The ion milling device according to claim 9, wherein the nozzle is disposed to supply the water vapor from a side surface of the specimen container into the specimen container.

12. The ion milling device according to claim 9, further comprising:
a cooling mechanism; and
a braided wire that connects the shielding plate and the cooling mechanism, wherein
the specimen is cooled via the shielding plate.

13. An ion milling device comprising:
a vacuum chamber configured to hold a specimen in a vacuum atmosphere;

an ion gun configured to irradiate the specimen with a non-focused ion beam;

a vaporization container configured to store a mixed solution of a water-soluble ionic liquid and water;

a nozzle configured to supply water vapor obtained by vaporizing the mixed solution to a vicinity of a surface of the specimen processed by the ion beam;

a first dew point meter configured to measure humidity in the vaporization container;

a second dew point meter configured to measure humidity in the vicinity of the surface of the specimen processed by the ion beam; and a humidity control unit configured to control an amount of the water vapor supplied from the nozzle based on a measured value of the first dew point meter and a measured value of the second dew point meter.

14. The ion milling device according to claim 13, wherein the humidity control unit continuously or intermittently supplies the water vapor from the nozzle.

* * * * *